United States Patent [19]
Olson

[11] 3,947,934
[45] Apr. 6, 1976

[54] METHOD OF TUNING A TUNABLE MICROELECTRONIC LC CIRCUIT

[75] Inventor: Larry Alan Olson, Indianapolis, Ind.

[73] Assignee: RCA Corporation, New York, N.Y.

[22] Filed: Aug. 7, 1974

[21] Appl. No.: 495,424

Related U.S. Application Data

[63] Continuation of Ser. No. 381,178, July 20, 1973, abandoned.

[52] U.S. Cl. .............. 29/25.42; 29/593; 29/602 R; 317/101 A; 333/70 S; 336/200
[51] Int. Cl.² .................. H01F 21/00; H03H 3/00
[58] Field of Search .......... 29/593, 602, 25.42, 625; 204/15; 336/200; 333/70 S; 317/256, 101 C; 324/81

[56] References Cited
UNITED STATES PATENTS

| | | | |
|---|---|---|---|
| 1,580,057 | 4/1926 | Lewis | 29/25.42 |
| 2,474,988 | 7/1949 | Sargrove | 204/15 |
| 2,568,169 | 9/1951 | Raczynski | 29/602 |
| 2,718,623 | 9/1955 | Yoder et al. | 336/200 |
| 3,471,812 | 10/1969 | Lackner | 333/70 S |
| 3,508,457 | 4/1970 | Ogston | 29/602 |
| 3,512,254 | 5/1970 | Jenkins et al. | 29/625 |
| 3,547,604 | 12/1970 | Davis, Jr. et al. | 29/593 |
| 3,622,878 | 11/1971 | Feulner | 324/81 |
| 3,665,570 | 5/1972 | Brooks | 29/593 |

FOREIGN PATENTS OR APPLICATIONS

| | | | |
|---|---|---|---|
| 1,227,531 | 10/1966 | Germany | 336/200 |

*Primary Examiner*—Alfred E. Smith
*Assistant Examiner*—Wm. H. Punter
*Attorney, Agent, or Firm*—Glenn H. Bruestle; Arthur E. Wilfond; William S. Hill

[57] ABSTRACT

A microelectronic LC circuit capable of being tuned to a desired center resonant frequency, comprising a trimmable capacitor, a principal fixed inductor and a printed trimmable inductor having an inductance which is small compared to that of the principal inductor. The printed inductor is one which is capable of having its inductance raised by trimming. In some cases, the fixed inductor can be omitted.

4 Claims, 3 Drawing Figures

METHOD OF TUNING A TUNABLE MICROELECTRONIC LC CIRCUIT

This is a continuation of application Ser. No. 381,178, filed July 20, 1973, now abandoned.

BACKGROUND OF THE INVENTION

A resonant LC circuit which is composed of a conventional chip capacitor such as a multilayer ceramic capacitor, and an inductor, such as one composed of a coil of wire and a core of either compressed, sintered iron powder or a compressed, sintered, powdered ferrite, can be tuned to a desired center frequency either by abrading away a part of the capacitor, or adjusting the core of the inductor, or a combination of both. Abrading a capacitor reduces its capacitance and raises the resonant frequency of the circuit. However, it is difficult to stop the abrading operation at the exact instant required to adjust the resonant frequency of a circuit to a precise desired value. There is a tendency to overshoot the value being sought. If the abrading is conducted at a speed slow enough to achieve reasonable accuracy, the operation usually takes too long to be economical.

In a conventional circuit, the core of the inductor may be varied in position to achieve either an increase or decrease in the resonant frequency of an LC circuit. Thus, fine adjustment of resonant frequency is not solely dependent upon adjustment of the capacitor. However, adjusting the position of the core also may become uneconomical if too much time is consumed in doing it.

Microminiature hybrid circuits often include some form of printed capacitor and almost always include printed resistors. Inductors may also be printed if the inductance required is relatively small. In the past, printed inductors have usually comprised a flat spiral of vapor deposited metal with or without an associated layer of a magnetic material to increase the inductance. However, if the inductance required is large, the present state of the art is not conducive to use of a printed inductor. Instead, a mounted coil or other more conventional type inductor is used. If the hybrid type circuit is used as an LC resonant frequency circuit, most of the same problems appear in adjusting the circuit to a desired center frequency, as were present with the older type circuits.

One aspect of the present invention is an improved hybrid type microminiature LC circuit which includes a trimmable capacitor, a principal inductor which may be of conventional wire coil type or a printed type, and a second inductor, of the printed type, having a value of inductance which is small compared to that of the principal inductor. By "printed" is meant any flat-conductor type whether the conductive material is deposited by screen printing or by some other method such as deposition through a stencil. The second inductor may have its inductance changed in such small increments that a fine adjustment of inductance is possible. The second inductor is also of a type which can have its inductance increased by trimming. If the required inductance is not too large, the printed inductor may constitute the total inductance of the circuit.

The invention also includes a method of adjusting the above type circuit to tune it to a desired resonant center frequency. One aspect of the method comprises removal of part of the capacitor so as to lower the capacitance and, at the same time, raise the resonant center frequency of the circuit somewhat above the desired value in a rough or approximate manner, and then trimming the printed inductor so as to raise its inductance. The inductor is trimmed sufficiently in a fine adjustment to lower the resonant center frequency of the circuit to the desired value.

The invention also includes increasing the inductance of an inductor, in a fine adjustment, by a trimming operation and it also includes an inductor that is adapted to have its inductance raised by so trimming.

THE DRAWING

DESCRIPTION OF PREFERRED EMBODIMENT

Figure 1:
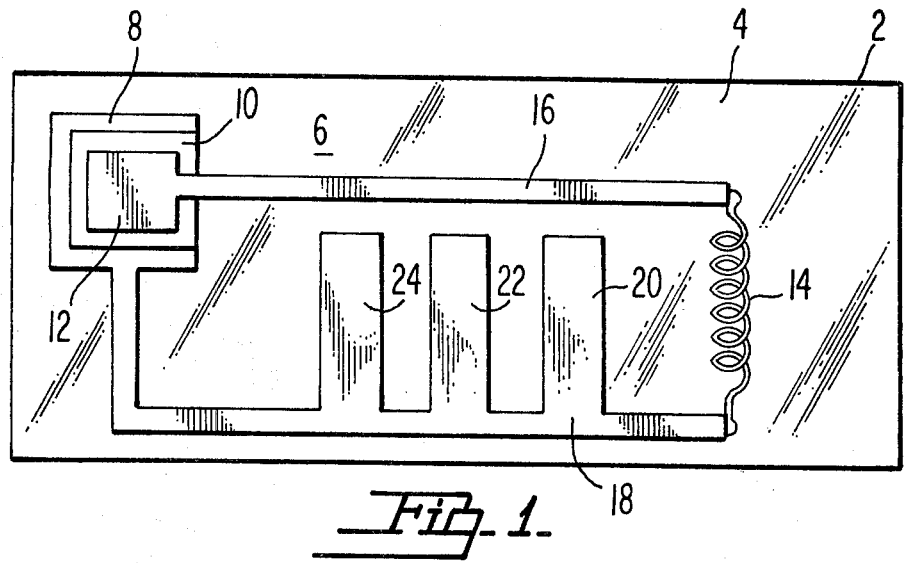
FIG. 1 is a plan view of an LC hybrid circuit in accordance with one embodiment of the invention, before trimming.

The invention may be applied to a hybrid circuit on a ceramic substrate. As illustrated in FIG. 1, the substrate may be a 95% alumina, rectangular shaped plate 2. On one surface 4 of the substrate may be a printed capacitor 6 having a lower metallic electrode 8, an intermediate dielectric layer 10 and a top metallic electrode 12. The metallic electrodes 8 and 12 may be made, for example, by printing the defined areas with an ink composed of particles of silver, palladium and palladium oxide and a glass frit, with sufficient organic solvent to make a thick paste. The ink is deposited on the substrate 4 (or on the dielectric layer 10) by screen printing. The solvent is driven off by heating in an oven and the dried films are then fired to fuse the glass. The dielectric layer 10 may comprise a glass frit without the metallic particles.

As far as this embodiment of the invention is concerned, the capacitor 6 could also be made by vapor depositing layers of metal and dielectric. Or, the capacitor 6 could even be a multilayer chip capacitor capable of being trimmed to reduce its capacitance.

The circuit also includes a principal inductor 14, which may be a conventional wire-wound coil of appropriate size to be mounted on the substrate 2, or it may be a conventional printed inductor. The inductor 14 is connected in parallel with the capacitor 6 by means of printed conductors 16 and 18. The coil should preferably be mounted after the circuit has been fired to cure the printed portions.

Connected to the conductor 18 are 3 parallel printed conductive stripes 20, 22 and 24. The stripes 20, 22 and 24 are disposed perpendicularly to and thus depend from the conductor 18. Before any trimming, the conductor 18 constitutes a second inductance. By trimming such that the length of the conducting path is increased by using the stripes, the inductance of the second inductor is increased and the total inductance is, of course, increased. The resonant frequency of the circuit can thus be adjusted. In the circuit illustrated, the dimensions of the stripes are chosen such that when they are trimmed in a manner which will be explained, the total inductance in the circuit can be preferably increased by as much as about 5% although this figure could be varied considerably depending upon the particular circuit being adjusted. The amount of maximum inductance that can be designed into the stripe portion of the circuit depends mostly upon the substrate area that can be allocated. It is usually uneconomical to use up large areas of the substrate with a printed inductor.

The stripes 20, 22 and 24 can be made of the same cermet materials as the conductors 16 and 18 so that when the circuit is fired, there will be no problems because of different materials. In the present example, each stripe has dimensions of 1 inch by 0.180 inch and a thickness of 0.075 inch.

The present method can be carried out as follows. The resonant center frequency, $f_o$, of an LC circuit is expressed by the equation:

$$f_o = \frac{1}{2\pi\sqrt{LC}}$$

where $f_o$ is given in hertz, L is given in henries, and C is given in farads. The capacitor is usually designed such that, as originally printed and fired, it has a capacitance of 120 – 130% of the desired capacitance after trimming. To achieve a particular calculated center frequency $f_o$, the size of the capacitor 6 and of the principal inductor 14 may be varied over a considerable range. As indicated above, the dimensions of the stripes 20, 22 and 24 in the circuit of this example, are chosen so that whatever is the selected size (inductance) of the inductor 14, trimming the stripes can increase the total inductance by as much as about 5%.

Figure 2:
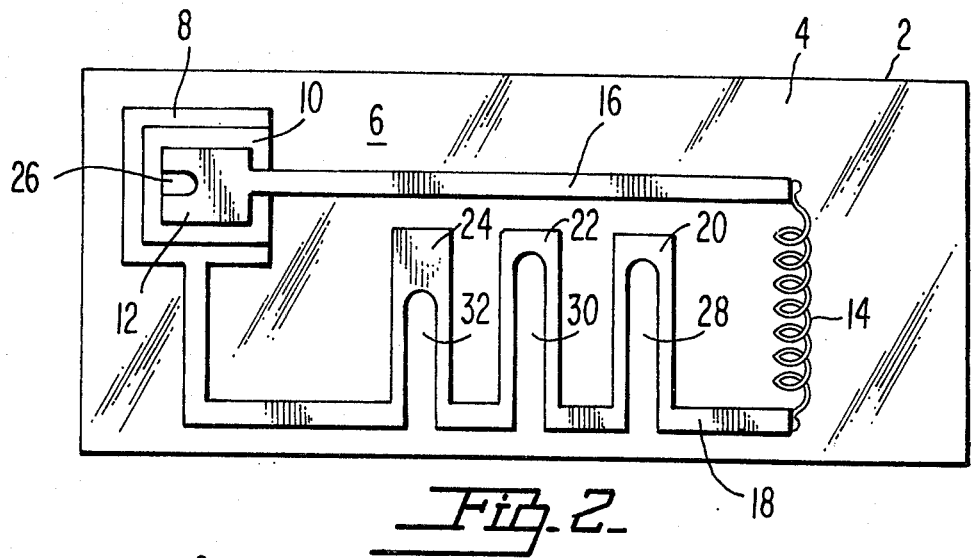
FIG. 2 is a similar view of the circuit after trimming.

The resonant frequency without any trimming of the components is measured and the capacitance change needed to achieve the desired $f_o$ is calculated. The capacitance of the capacitor 6 is then reduced (FIG. 2) by abrading away (or volatilizing with a laser beam) a part of the top electrode 12 to form a notch 26. Because of an inherent lack of precision in the abrading process when it is carried out at reasonable speeds, it is preferred to reduce the capacitance slightly more than just enough to achieve the desired $f_o$. For example, the capacitance is preferably reduced so as to get an $f_o$ of about 103% of that finally desired.

To bring the resonant frequency back down to the desired value, the stripes 20, 22 and 24 (FIG. 2) are then abraded one-at-a-time by removing increments of the central portion of each stripe, while monitoring the center resonant frequency of the circuit, until the desired resonant frequency is achieved. For example, one may begin with stripe 20 and abrade to form a notch 28, beginning at the proximal end of the stripe and working toward its distal end. In this example, the notch is 0.060 inch wide. The presence of the notch 28 increases the effective length of the conductor 18 and this raises the inductance of the printed inductor by a small amount. If this is not sufficient to lower the resonant frequency to the desired value, a second notch 30 is cut in stripe 22, etc. A larger or smaller number of stripes can be provided, and/or the stripes can be made longer or shorter to provide for greater or lesser maximum changes in inductance.

In the circuit illustrated, cutting notches 0.060 inch wide in all three stripes provides an increase in inductance of 0.08 $\mu$h measured at 1MHZ. Before trimming, the measured inductance of the conductor 18 was 0.03$\mu$h. After trimming, it was 0.11 $\mu$h.

The following table shows resonant frequency changes which can be achieved with various values of capacitance and large inductance. In the table, L is the inductance of the coil 14, C is the capacitance of the capacitor 6, $f_o$ is the resonant frequency of the circuit before trimming the inductor, $f'_o$ is the resonant frequency after trimming the inductor stripes 20, 22, 24 to the maximum extent and $\Delta f$ is the change in resonant frequency achieved.

| L ($\mu$h) | C (pF) | $f_o$ (MHZ) | $f'_o$ (MHZ) | $\Delta f$ |
|---|---|---|---|---|
| 15 | 70 | 4.91 | 4.89 | 12.7 KHZ |
| 5 | 20 | 15.91 | 15.79 | 125.49 KHZ |
| 1 | 10 | 50.32 | 48.43 | 1.9 MHZ |

The capacitance and the inductance may be adjusted at different times during the manufacturing operation. For example, the capacitance may be trimmed before the circuit is encapsulated and before active devices are attached. The printed trimmable inductor may be trimmed after the circuit is partially encapsulated. It may be desirable to do this, if encapsulation changes the resonant frequency of the circuit.

Although the invention has thus far been described in connection with adjusting the center resonant frequency of an LC circuit, it can also be applied in any situation where it is desired to increase the inductance of an inductor using a fine adjustment which can be carried out with automatic equipment. Any fixed inductor mounted on a substrate can be provided with an associated trimmable inductor of the type illustrated. Trimming can be carried out using conventional air stream abrading or laser trimming apparatus.

Figure 3:
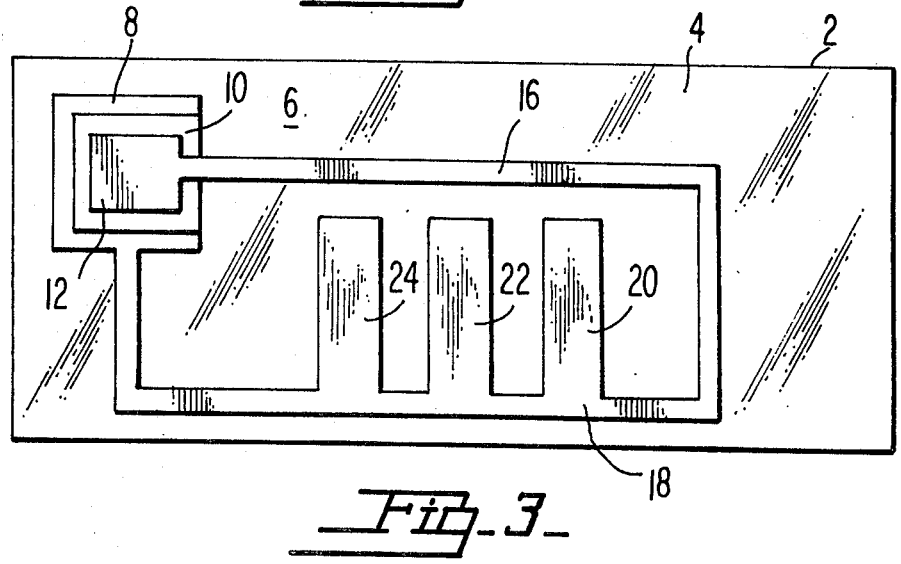
FIG. 3 is a similar view of an alternative form of the circuit of FIG. 1.

Still another aspect of the invention is the provision without any relation to a fixed coil, of a printed inductor that may have its inductance increased by trimming. Some circuits utilize inductances of small enough magnitude so that a mounted coil is not required. A circuit of this type is illustrated in FIG. 3. In the circuit of FIG. 3 the only inductance is provided by the conductor 18, and, after trimming, of the increased conducting path through one or more of the stripes 20, 22 and 24.

In the type of circuit illustrated in FIG. 3, where both the capacitor and the inductor are made of cermet inks, it is sometimes possible to use a single firing to bring the circuit almost to its desired resonant frequency. However, after the firing operation, the resonant frequency may be somewhat below or somewhat above the desired value. Depending upon which of these two conditions exists, either the capacitor or the inductor may be trimmed to achieve the desired resonant frequency.

It is known that the capacitance of a printed capacitor made of cermet materials may be varied by varying either or both of the peak firing temperature or the firing time. It is also known that the conductivity of printed cermet conductors can be varied by varying these same two firing parameters.

I claim:
1. A method of tuning a frequency resonant microelectronic circuit which includes an adjustable printed capacitor and a fixed principal inductor, to a desired center frequency, where the capacitor has a value higher than the final adjusted value comprising:
   providing a printed trimmable inductor having substantially less inductance than said fixed principal inductor, in series with said principal inductor, said trimmable inductor being capable of being trimmed to increase its inductance, trimming said capacitor whereby the resonant frequency of the circuit increases, said trimming being carried out until the resonant frequency of the circuit reaches a value somewhat higher than said desired center frequency, and then trimming said trimmable inductor to cause the center frequency to decrease to the desired value.

2. A method according to claim 1 in which said trimmable inductor comprises a series of stripes each connected at one end to a main conductor and composed of a fused cermet material on a ceramic substrate.

3. A method according to claim 2 in which the trimming of the trimmable inductor is done by removing material from the center of at least one of said stripes.

4. A method of tuning a frequency resonant LC circuit having a principal fixed inductor that represents a large proportion of the total circuit inductance required, and an adjustable printed capacitor, comprising providing a relatively small value printed inductor in series with said fixed inductor, lowering the capacitance of said printed capacitor to obtain a resonant circuit frequency higher than that desired, and then trimming said printed inductor to lower the resonant frequency of the circuit to that desired.

* * * * *